United States Patent
Iwane

(10) Patent No.: US 8,368,431 B2
(45) Date of Patent: Feb. 5, 2013

(54) PULSE EDGE SELECTION CIRCUIT, AND PULSE GENERATION CIRCUIT, SAMPLE-HOLD CIRCUIT, AND SOLID-STATE IMAGE SENSOR USING THE SAME

(75) Inventor: Masaaki Iwane, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 246 days.

(21) Appl. No.: 12/957,187

(22) Filed: Nov. 30, 2010

(65) Prior Publication Data

US 2011/0156939 A1 Jun. 30, 2011

(30) Foreign Application Priority Data

Dec. 28, 2009 (JP) .................. 2009-298821

(51) Int. Cl.
*H03K 17/00* (2006.01)
(52) U.S. Cl. ......................................................... 327/99
(58) Field of Classification Search .................... 327/99, 327/407, 408
See application file for complete search history.

(56) References Cited

U.S. PATENT DOCUMENTS 7,884,652 B2 * 2/2011 Suzuki ............................ 327/99
2011/0032009 A1 2/2011 Iwane ........................... 327/142

FOREIGN PATENT DOCUMENTS

JP 2009-044579 2/2009

* cited by examiner

Primary Examiner — Hai L Nguyen
(74) Attorney, Agent, or Firm — Fitzpatrick, Cella, Harper & Scinto

(57) ABSTRACT

A pulse edge selection circuit includes an input stage which selects and passes one clock from among a plurality of clocks and an output stage which outputs the clock to an edge detection circuit. The output stage has a combination of a plurality of NOR gates and a plurality of NAND gates, which are connected alternately, both the NOR gates and NAND gates having a plurality of input terminals. If the edge detection circuit is a type which detects falling edges of clocks and generates a pulse which rises on the falling edge of a first clock and falls on the falling edge of a second clock, a NOR gate is used as an output gate which outputs the first clock and the second clock. On the other hand, if a pulse is generated on rising edges, a NAND gate is used as an output gate.

7 Claims, 10 Drawing Sheets

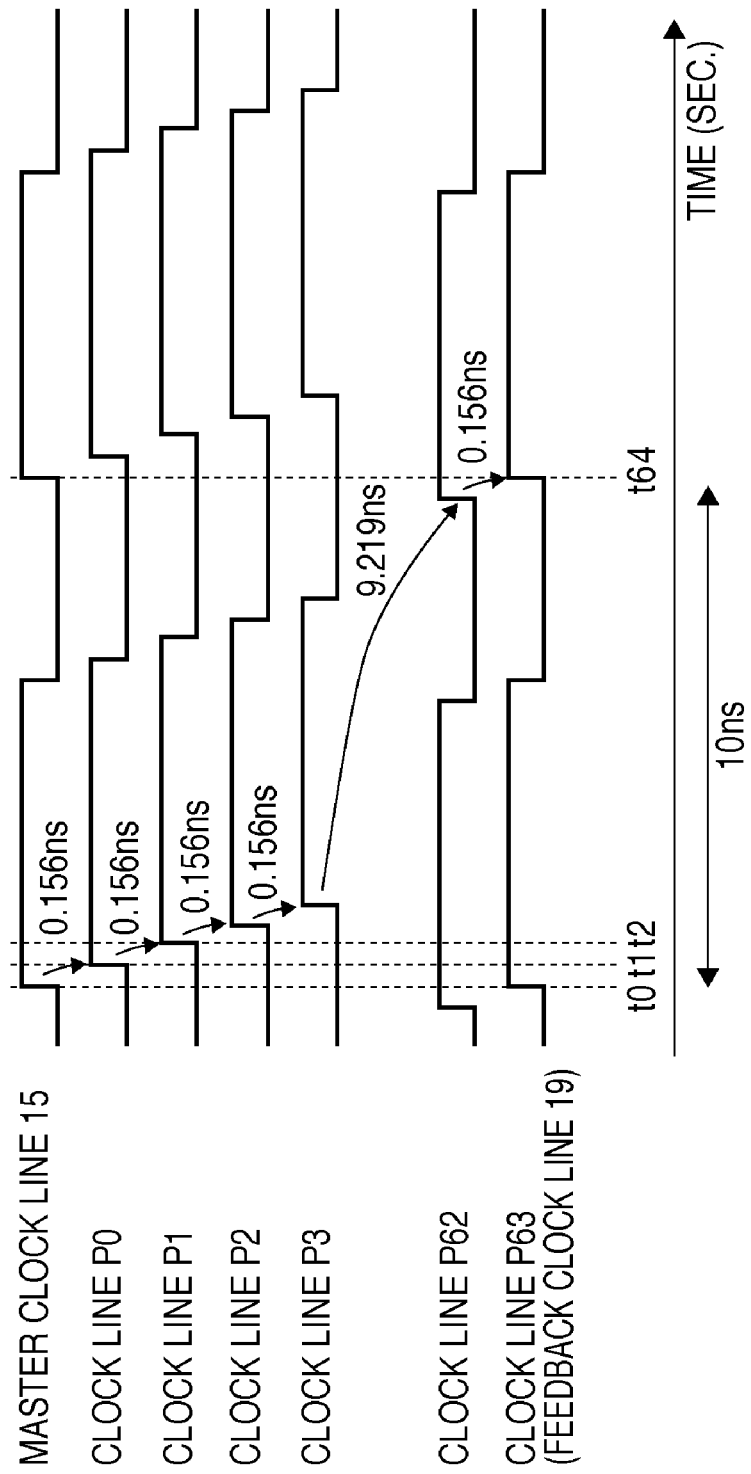

PULSE EDGE SELECTION CIRCUIT, AND PULSE GENERATION CIRCUIT, SAMPLE-HOLD CIRCUIT, AND SOLID-STATE IMAGE SENSOR USING THE SAME

BACKGROUND OF THE INVENTION

1. Field of the Invention

The present invention relates to a pulse edge selection circuit which generates pulses of desired pulse timing and desired pulse width using a multiphase clock, and more particularly, to a pulse edge selection circuit which uses a delay locked loop circuit as well as to a pulse generation circuit, sample-hold circuit, and solid-state image sensor which use the pulse edge selection circuit.

2. Description of the Related Art

Semiconductor devices including solid-state image sensors are becoming increasingly fast, requiring ever more subtle adjustments of phase relationships among their drive pulses. Japanese Patent Laid-Open No. 2009-044579 (D1) discloses a pulse edge selection circuit which adjusts pulse edge timing by means of register settings. The circuit disclosed in D1 selects a clock from a multiphase clock on a tournament basis using a transfer gate.

However, the clock selection method using a tournament-based selector such as disclosed in D1 drives even unselected logic gates such as a buffer when inputting clocks thereto, resulting in increased power consumption. For example, to select one clock from N clocks, N/2 clocks are selected by the logic gates in the first stage. Next, N/4 clocks are selected by the logic gates in the second stage, and subsequently narrowed down to one clock by the logic gate in an output stage. Therefore, at least N−1 (=N/2+N/4+...+1) logic gates are put into operation by the clocks. When a clock is input to a logic gate, power consumption of the logic gate is increased accordingly due to a through current and the like. Thus, a tournament-based clock selection circuit consumes a large amount of power because a large number of logic gates are simultaneously put into operation. Examples of the logic gate as referred to herein include a NAND gate, NOR gate, inverter, buffer, tristate inverter, tristate buffer, and transfer gate.

SUMMARY OF THE INVENTION

An aspect of the present invention is to solve the above-mentioned problems with the conventional technology.

It is a feature of the present invention to provide a pulse edge selection circuit which cuts down on power consumption by reducing the number of activated logic gates and shortens clock delays by reducing the number of logic gates through which clocks pass as well as to provide a pulse generation circuit, sample-hold circuit, and solid-state image sensor which use the pulse edge selection circuit.

According to an aspect of the present invention, there is provided a pulse edge selection circuit comprising:

a first clock selection circuit adapted to select and output a first clock used to determine a rising edge of a pulse from among a plurality of clocks shifted in phase; a second clock selection circuit adapted to select and output a second clock used to determine a falling edge of the pulse from among the plurality of clocks; and an edge detection circuit adapted to generate the pulse using the first clock and the second clock, the edge detection circuit including a first input terminal which accepts input of the first clock from the first clock selection circuit, a second input terminal which accepts input of the second clock from the second clock selection circuit, and an output terminal which outputs the pulse, wherein each of the first clock selection circuit and the second clock selection circuit comprises an input stage to accept input of the plurality of clocks and select and pass one clock from among the plurality of clocks, and an output stage to output the selected and passed clock to the edge detection circuit, the edge detection circuit detects falling edges of the first clock and the second clock inputted to the first input terminal or the second input terminal from the first clock selection circuit and the second clock selection circuit and generates the pulse which rises on the falling edge of the first clock and falls on the falling edge of the second clock, and the output stage of each of the first clock selection circuit and the second clock selection circuit is a combination of a plurality of NOR gates having a plurality of input terminals and a plurality of NAND gates having a plurality of input terminals, the plurality of NOR gates and the plurality of NAND gates are interconnected such that an input of a NOR gate is connected to an output of a NAND gate and that the input of the NAND gate or an input of another NAND gate is connected to an output of another NOR gate, and a NOR gate is used as an output gate which outputs the first clock and the second clock.

Further features and aspects of the present invention will become apparent from the following description of exemplary embodiments, with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 3A is a timing chart describing an exemplary operation of a master clock and multiphase clock in a DLL shown in FIG. 1;

DESCRIPTION OF THE EMBODIMENTS

Embodiments of the present invention will now be described hereinafter in detail, with reference to the accompanying drawings. It is to be understood that the following embodiments are not intended to limit the claims of the present invention, and that not all of the combinations of the aspects that are described according to the following embodiments are necessarily required with respect to the means to solve the problems according to the present invention.

Figure 1:
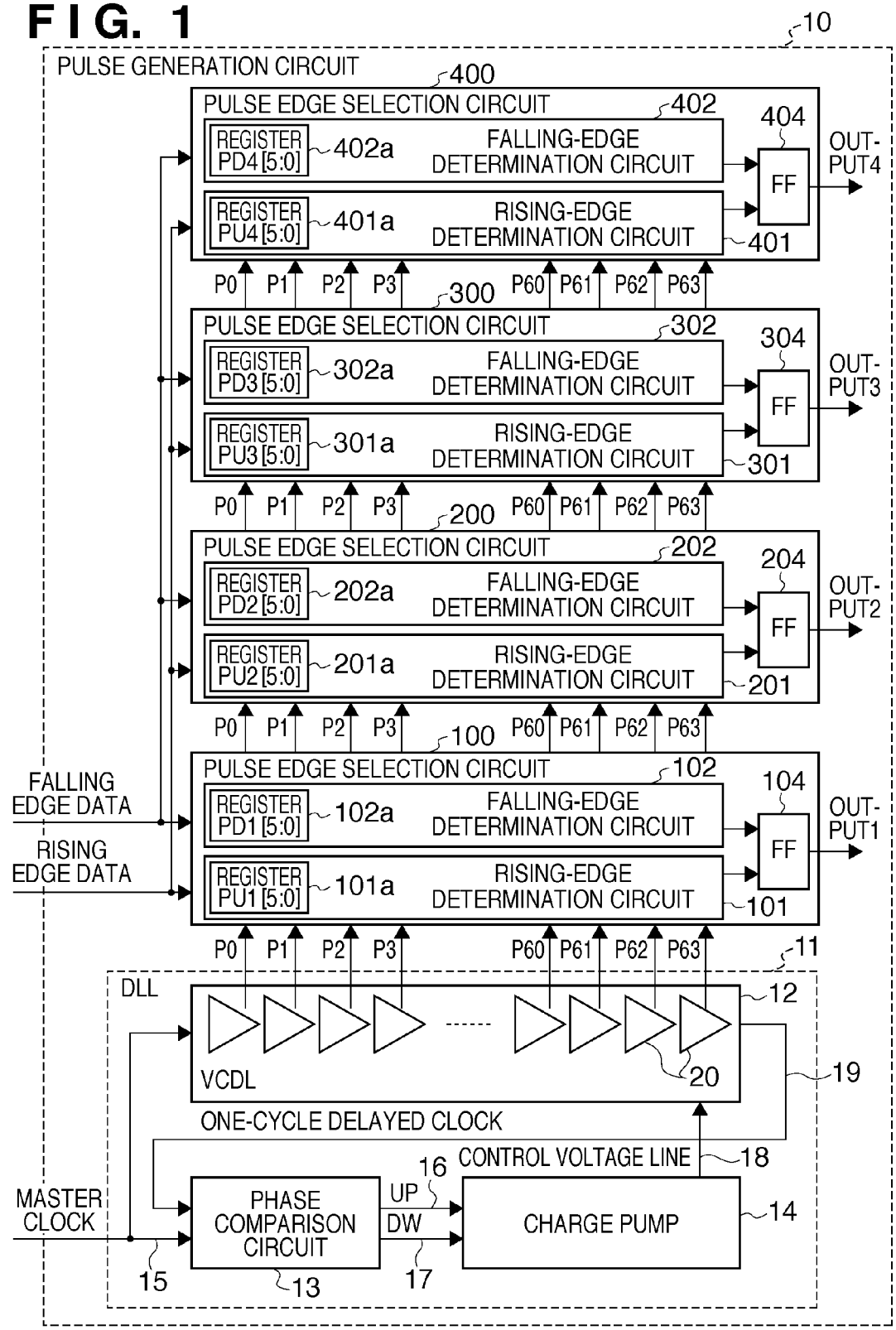
FIG. 1 is a block diagram showing an exemplary configuration of a pulse generation circuit according to the present embodiment.

Exemplary Configuration of Pulse Generation Circuit According to Present Embodiment FIG. 1 is a block diagram of a pulse generation circuit 10 which includes a delay locked loop circuit (hereinafter abbreviated to DLL) 11 configured to generate a multiphase clock and a plurality of pulse edge selection circuits according to the present embodiment. The pulse generation circuit 10 in FIG. 1 includes the DLL 11 which is a clock generation circuit as well as four pulse edge selection circuits 100, 200, 300, and 400.

The DLL 11 includes a voltage controlled delay line (hereinafter abbreviated to VCDL) 12, phase comparison circuit 13, and charge pump 14, where the VCDL 12 in turn includes multiple voltage controlled delay devices 20. Besides, reference numeral 15 denotes a master clock line, reference numeral 16 denotes an up-signal line, reference numeral 17 denotes a down-signal line, reference numeral 18 denotes a control voltage line, and reference numeral 19 denotes a feedback clock line. In the present embodiment, following description is made assuming that a 100-MHz clock is input to the master clock line 15. The DLL 11 supplies a multiphase clock whose phases are shifted at equal intervals to the four pulse edge selection circuits 100, 200, 300, and 400 via clock lines (P0, P1, P2, . . . , P63). Although in the present embodiment, the multiphase clock is input to 64 clock lines (P0 to P63), the present invention is not limited to this number. Through the master clock line 15, a master clock is supplied to the phase comparison circuit 13 and VCDL 12. The VCDL 12 includes 64 voltage controlled delay devices 20 which can change amounts of clock delay according to a voltage value of the control voltage line 18. Clock lines (P0, P1, P2, . . . , P63) are connected as output terminals to the respective voltage controlled delay devices 20.

An output clock of the last voltage controlled delay device 20 of the VCDL 12 is supplied to the phase comparison circuit 13 through the feedback clock line 19. The phase comparison circuit 13 is connected with the master clock line 15 and feedback clock line 19 serving as input terminals. The phase comparison circuit 13 outputs pulses to the up-signal line 16 and down-signal line 17 such that a one-cycle delayed master clock of the master clock line 15 will coincide in phase with the feedback clock of the feedback clock line 19. For example, if a rising edge of the feedback clock on the feedback clock line 19 is earlier than a rising edge of a one-cycle delayed clock of the master clock on the master clock line 15, a down-signal pulse is output to the down-signal line 17. On the other hand, if a rising edge of the feedback clock is later than a one-cycle delayed rising edge of the master clock, an up-signal pulse is output to the up-signal line 16. If the rising edge of the one-cycle delayed master clock coincides with the rising edge of the feedback clock, synchronized state is reached. In the synchronized state, either no pulse is output to the up-signal line 16 and down-signal line 17 or the up-signal pulse and down-signal pulse become identical. The charge pump 14 raises the voltage value of the control voltage line 18 upon receiving an up-signal pulse via the up-signal line 16, and lowers the voltage value of the control voltage line 18 upon receiving a down-signal via the down-signal line 17.

The four pulse edge selection circuits 100, 200, 300, and 400 are identical circuits, and are connected, respectively, with the clock lines (P0, P1, P2, . . . , P63) serving as input terminals. Rising edge data is input in each of the pulse edge selection circuits in order for rising-edge determination circuits to identify a rising edge of the pulse. Also, a falling edge data is input in order for falling-edge determination circuits to identify a falling edge of the pulse. Each pulse edge selection circuit includes a rising-edge determination circuit 101, 201, 301, or 401; falling-edge determination circuit 102, 202, 302, or 402; and falling edge-triggered flip-flop 104, 204, 304, or 404. The rising-edge determination circuits 101, 201, 301, and 401 include respective registers PU1[5:0] to PU4[5:0] (101a, 201a, 301a, and 401a) which hold rising edge data. On the other hand, falling-edge determination circuits 102, 202, 302, and 402 include respective registers PD1[5:0] to PD4[5:0] (102a, 202a, 302a, and 402a) which hold falling edge data. Incidentally, the rising-edge determination circuits 101, 201, 301, and 401 are designated as first clock selection circuits and output therefrom is designated as a first clock. Also, the falling-edge determination circuits 102, 202, 302, and 402 are designated as second clock selection circuits and output therefrom is designated as a second clock. Detailed embodiments of the pulse edge selection circuit are shown below.

First Embodiment

<Exemplary Configuration of Pulse Edge Selection Circuit According to First Embodiment>

Figure 2A:
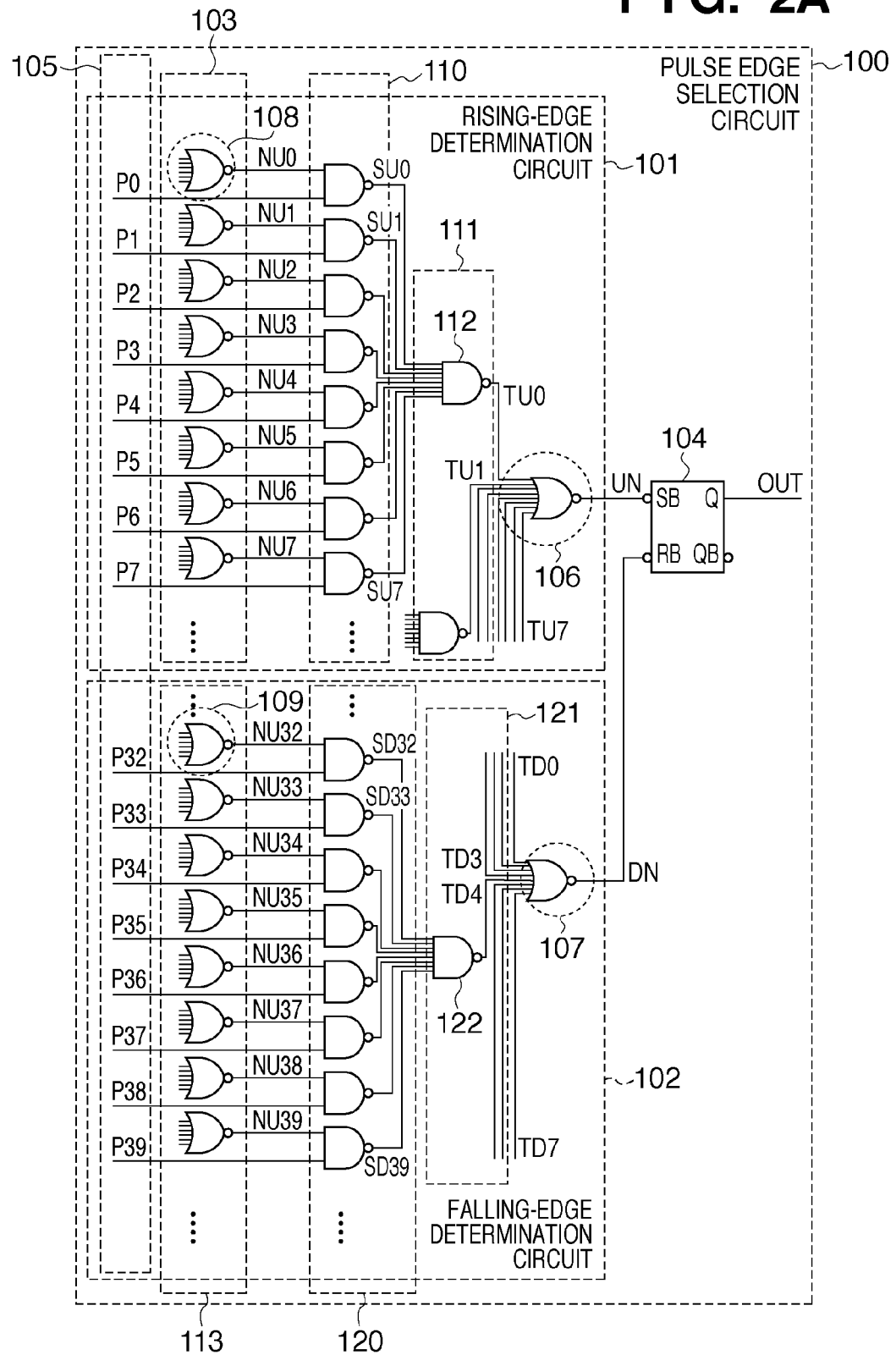
FIG. 2A is a circuit diagram showing an exemplary configuration of a pulse edge selection circuit according to a first embodiment.

FIG. 2A is a circuit diagram of a first embodiment of the pulse edge selection circuit 100 shown in FIG. 1. In FIG. 2A, reference numeral 101 denotes the rising-edge determination circuit, reference numeral 102 denotes the falling-edge determination circuit, reference numerals 103 and 113 denote NOR gate decoder groups, reference numeral 104 denotes the falling edge-triggered flip-flop, and reference numeral 105 denotes a multiphase clock line group. Also, reference numeral 106 denotes a NOR gate in an output stage of the rising-edge determination circuit 101, and reference numeral 107 denotes a NOR gate in an output stage of the falling-edge determination circuit 102. Also, reference numerals 108 and 109 denote selected NOR gate decoders, reference numerals 110 and 120 denote NAND gate groups in the first stage, and reference numerals 111 and 121 denote NAND gate groups in the second stage. The configuration of the pulse edge selection circuit 100 according to the first embodiment shown in FIG. 2A is also applied to the other pulse edge selection circuits 200, 300, and 400.

In the pulse edge selection circuit 100 according to the first embodiment shown in FIG. 2A, the NAND gate groups 110 and 120 in the first stage select only a single clock each: a clock for a rising edge and a clock for a falling edge, respectively. The selected clocks generate a desired pulse by setting and resetting the falling edge-triggered flip-flop 104 via the NAND gate groups 111 and 121 in the second stage and the NOR gates 106 and 107 (which are output gates). Thus, the activated logic gates are eight logic gates of the edge determination circuits 101 and 102 plus the falling edge-triggered flip-flop 104. In this way, the first embodiment cuts down on power consumption by reducing the number of activated logic gates. Also, the number of logic gates through which clocks pass are three stages each of the edge determination circuits 101 and 102 while the falling edge-triggered flip-flop 104 changes output Q on the falling edge of an input pulse without a disabled state. In this way, the first embodiment shortens clock delays by reducing the number of logic gates through which clocks pass. Incidentally, the NAND gate groups 110 and 120 in the first stage are designated as the input stage which passes the selected clock while the subsequent logic gates up to the output of the falling edge-triggered flip-flop 104 are designated as the output stage.

(Exemplary Circuit of Falling Edge-Triggered Flip-Flop)

Figure 2B:
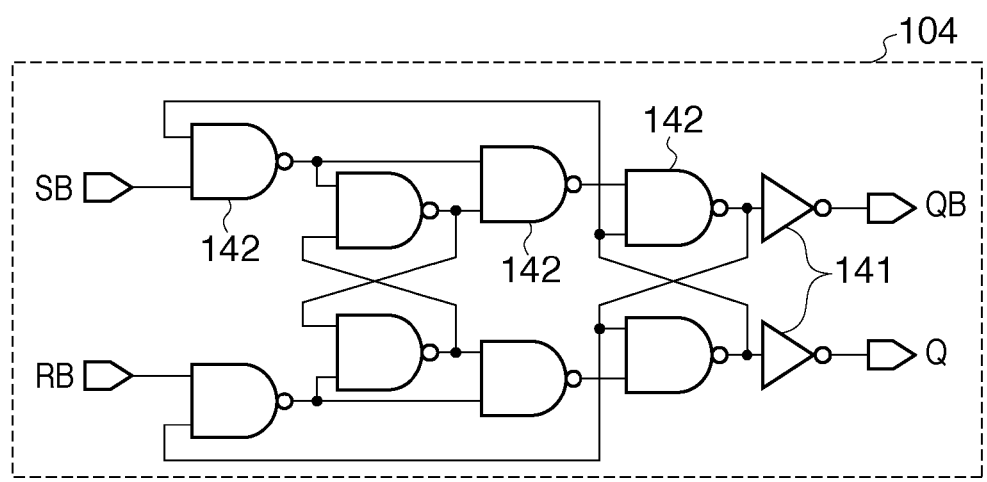
FIG. 2B is a circuit diagram showing an exemplary configuration of a falling edge-triggered flip-flop.

FIG. 2B is a circuit diagram of the falling edge-triggered flip-flop 104 shown in FIG. 2A. As shown in FIG. 2B, the falling edge-triggered flip-flop 104 includes multiple inverter gates 141 and NAND gates 142. The falling edge-triggered flip-flop 104 is a circuit which operates without a disable state (unconditionally) such that voltage of the output Q will rise when voltage of an input terminal SB of the falling edge-triggered flip-flop 104 falls and that the voltage of the output Q will fall when voltage of an input terminal RB falls. As shown in FIG. 2A, the input terminal SB of the falling edge-triggered flip-flop 104 is connected with an output wire UN of the rising-edge determination circuit 101 while the input terminal RB is connected with an output wire DN of the falling-edge determination circuit 102. On the other hand, an output terminal Q of the falling edge-triggered flip-flop 104 is connected with an output wire OUT of the pulse edge selection circuit 100. The falling edge-triggered flip-flop 104 is designated as an edge detection circuit, its input terminal SB is designated as a first input terminal, and the input terminal RB is designated as a second input terminal.

<Operation Timing Chart of DLL 11>

FIG. 3A is an operation timing chart describing clock timing for the master clock line 15 and clock lines (P0, P1, P2, . . . , P63) in the DLL 11 shown in FIG. 1, where the DLL 11 is in synchronized state. In FIG. 3A, the abscissa represents time while the ordinate represents voltage values of the master clock line 15 and clock lines (P0, P1, P2, . . . , P63). According to the present embodiment, since it is assumed that frequency of the master clock is 100 MHz, time difference between the time t0 of rising edge and the time t64 of next rising edge is 10 ns. Since the operation timing chart in FIG. 3A represents a synchronized state, difference between the time t0 of rising edge of the master clock and the time t1 of rising edge of the clock line P0 via the voltage controlled delay device 20 is 0.156 (=10/64) ns. The time difference corresponds to a delay time of the voltage controlled delay device 20. Similarly, difference between the time t1 of rising edge of the clock line P0 and the time t2 of rising edge of the clock line P1 is 0.156 ns. In this way, the difference in the time of rising edge between adjacent clock lines is 0.156 ns. That is, a phase shift between adjacent clock lines is 1/64 cycle. In a synchronized state, the time difference between the time t0 of rising edge of the master clock and the time t64 of rising edge of the clock line p63 is 10 ns. Also, time t64 corresponds to the time of next rising edge of the master clock line 15 after time t0. The multiphase clock with equally spaced delay times is generated in this way and output from the DLL 11 in FIG. 1 to the pulse edge selection circuits 100, 200, 300, and 400 via the clock lines (P0, P1, P2, . . . , P63).

<Operation Timing Chart of Pulse Edge Selection Circuit 100>

Figure 3B:
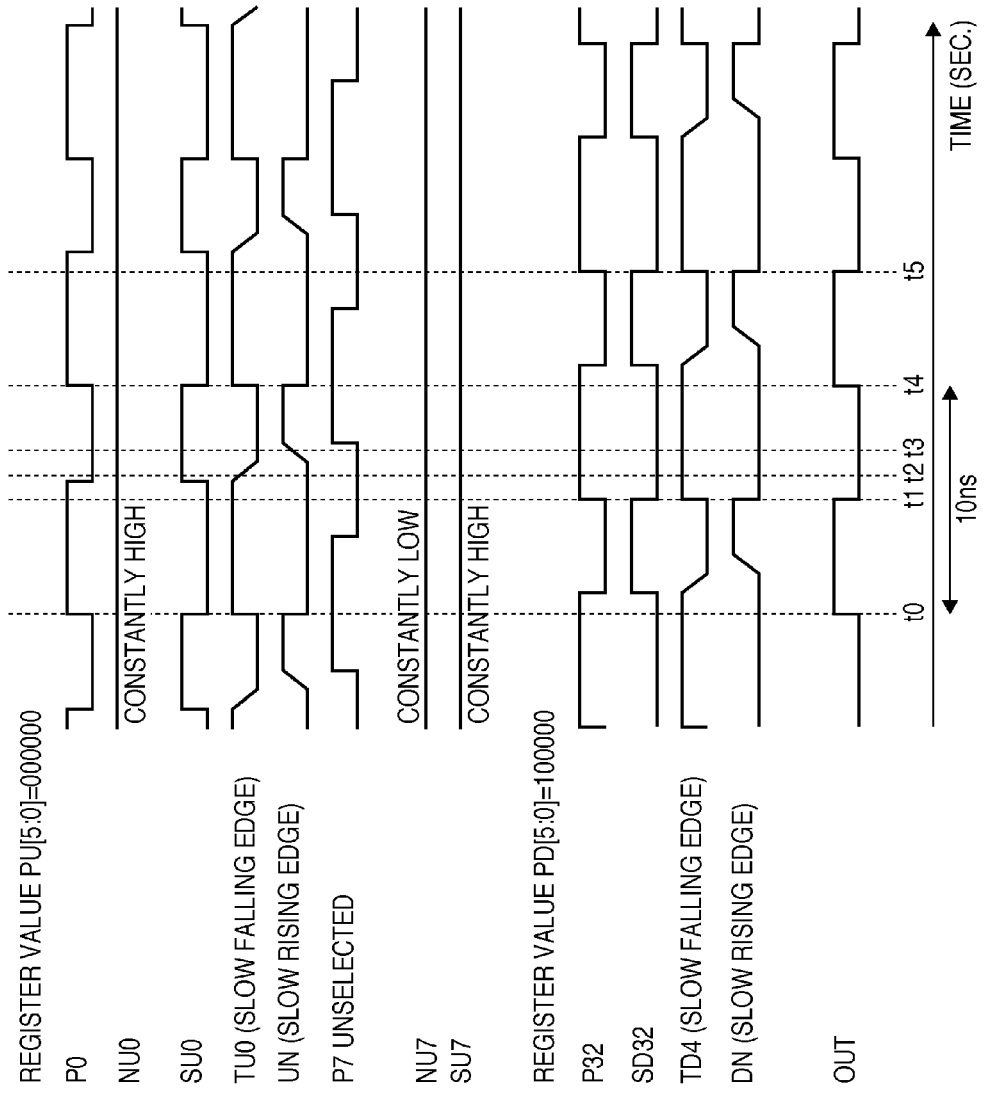
FIG. 3B is a timing chart describing an exemplary operation of the pulse edge selection circuit shown in FIG. 2A.

In the example of the first embodiment shown in FIG. 2A, the clock inputted in the clock line P0 is used for rising-edge determination and the clock inputted in the clock line P32 is used for falling-edge determination. Therefore, the NOR gate decoder 108 of the NOR gate decoder group 103 is selected for rising-edge determination. Similarly, the NOR gate decoder 109 of the NOR gate decoder group 113 is selected for falling-edge determination. FIG. 3B shows an operation timing chart of nodes in the pulse edge selection circuit 100 shown in FIG. 2A. In FIG. 3B, the abscissa represents time (seconds) while the ordinate represents voltage values of wires.

(Rising-Edge Determination)

First, the rising-edge determination circuit 101 selects the clock line P0 out of the 64 multiphase clock lines (P0, P1, P2, . . . , P63). Thus, a binary value of "000000" (=0 in decimal) is set on the register PU[5:0] 101a in the pulse edge selection circuit 100 based on inputted rising edge data. Consequently, the NOR gate decoder 108 is selected from the NOR gate decoder group 103. That is, only a wire NU0 becomes constantly High out of 64 output wires NU0, NU1, NU2, . . . , NU63 of the NOR gate decoder group 103. Although only a wire NU7 is shown in the timing chart of FIG. 3B, the 63 wires NU1, NU2, . . . , NU63 other than the wire NU0 are constantly Low. Consequently, out of 64 output wires SU0, SU1, SU2, . . . , SU63 of the NAND gate group 110 in the first stage, a clock is output only to the wire SU0 while the other 63 wires SU1, SU2, . . . , SU63 become constantly High. That is, 64 types of clock inputted via the multiphase clock lines (P0, P1, P2, . . . , P63) are narrowed down to a single type by the NAND gate group 110 in the first stage of the rising-edge determination circuit 101. Next, out of 8 output wires TU0, TU1, TU2, . . . , TU7 of the NAND gate group 111 in the second stage, a clock is output only to the wire TU0 while the other 7 wires TU1, TU2, . . . , TU7 become constantly Low. This is because input of the NAND gate group 111 in the second stage is always High except for a NAND gate 112. The 8 wires TU0, TU1, TU2, . . . , TU7 are connected to input terminals of the NOR gate 106 in the output stage of the rising-edge determination circuit 101.

Consequently, as shown in FIG. 3B, a signal obtained by inverting the clock on the wire TU0 is output to an output wire UN of the NOR gate 106. That is, a clock which falls simultaneously with the time (time t0 or t4 in FIG. 3B) of rise of the clock line P0 is output to the output wire UN of the rising-edge determination circuit 101, such that rising edges of a desired clock signal (OUT) are determined.

(Falling-Edge Determination)

The falling-edge determination circuit 102 selects the clock line P32 from the multiphase clock lines (P0, P1, P2, . . . , P63). Thus, a binary value of "100000" (=32 in decimal) is set on the register PD[5:0] 102a in the pulse edge selection circuit 100 based on inputted falling edge data. Consequently, the NOR gate decoder 109 is selected from the NOR gate decoder group 113. As a result, with the falling-edge determination circuit 102 operating in a manner similar to the rising-edge determination circuit 101 using the same number of stages and same number of logic gates as the rising-edge determination circuit 101, a clock which falls simultaneously with the time (time t1 or t5 in FIG. 3B) of rise of the clock line P32 is output to the output wire DN of the falling-edge determination circuit 102, such that falling edges of the desired clock signal (OUT) are determined.

Generally, the output clock of a NAND gate has a slow edge rate on a falling edge and the output clock of a NOR gate has a slow edge rate on a rising edge. Therefore, according to the first embodiment, the slow falling edges (at time t2 and the like in FIG. 3B) of the output clocks of the NAND gate groups 111 and 121 in the second stage are not used. Also, the slow rising edges of the output clocks of the NOR gates 106 and 107 in the output stage are not used. Also, the slow falling edges of the NAND gates and the slow rising edges of the NOR gates get slower with increases in the number of input terminals. Therefore, the NAND gates and NOR gates which handle clocks generally have not more than three inputs.

However, according to the first embodiment, since the falling edges of the NAND gates and the rising edges of the NOR gates are not used as shown in FIG. 3B, NAND gates and NOR gates with four or more inputs can be used for clocks. Actually, according to the first embodiment, outputs of the 8-input NAND gate 112 and 8-input NOR gates 106 and 107 are used for clocks. Besides, the NAND gate and NOR gates are interconnected. Moreover, the first embodiment allows NAND and NOR gates to have eight or more inputs.

The operation timing chart in FIG. 3B will be described in time sequence. NU0 is constantly High. At time t0, the multiphase clock P0 rises from Low to High and the voltage of the wire SU0 changes from High to Low. As the Low voltage of SU0 is input in the NAND gate 112, the potential of the wire TU0 changes from Low to High. In this way, when the High voltage of TU0 is input in the NOR gate 106, the voltage of the wire UN falls from High to Low. Consequently, the falling edge-triggered flip-flop 104 operates to change the output OUT (Q) from Low to High. At time t1, NU0 remains High, the multiphase clock P32 rises from Low to High, and the voltage of a wire SD32 changes from High to Low. In this way, as the Low voltage of SD32 is input in a NAND gate 122, the voltage of a wire TD4 changes from Low to High. When the High voltage of TD4 is input in the NOR gate 107, the voltage of the wire DN falls from High to Low. Consequently, the falling edge-triggered flip-flop 104 operates to change the output OUT (Q) from High to Low. Next, at time t2, the multiphase clock P0 falls from High to Low and the voltage of the wire SU0 changes from Low to High. At this point, although the wire TU0 changes from High to Low, since the wire TU0 is an output of the 8-input NAND gate 112, the voltage becomes Low at a slow edge rate as illustrated in FIG. 3B. Consequently, the voltage of the wire UN rises at a slow edge rate and becomes High at time t3 later than time t2. This is because the wire UN is an output of the 8-input NOR gate 106. There is a period, such as between times t2 and t3, in which voltage transition is slow, but the slowness does not appear in the output OUT as illustrated in FIG. 3B. At time t4, the same operations as at time t0 take place. Also, at time t5, the same operations as at time t1 take place.

As shown in the timing chart of FIG. 3B, a pulse which rises at the time (t0 or t4) of fall of the wire UN and falls at the time (t1 or t5) of fall of the wire DN is output to the wire OUT. According to the first embodiment, since the falling edge-triggered flip-flop 104 is used, the slow rising edges on the wires UN and DN are not used. Consequently, even if the NOR gates 106 and 107 are used in the clock output stage, slow rising edges do not present a problem. Also, a clock buffer may be connected to the outputs of the NOR gates 106 and 107 as required. However, the phase of the clock buffer must not be inverted. Since the first embodiment assumes the use of 64 types of 100-MHz clock differing in phase, pulses with a time resolution of 0.156 (=10/64) ns can be generated freely. The clock does not vary with the temperature, process, or source voltage fluctuations and features reduced power consumption. Actually, at a source voltage of 1.8 V, at a drive frequency of 100 MHz, and at room temperature, the pulse edge selection circuit according to the first embodiment consumed 1/10 or less power than conventional pulse edge selection circuits. Also, the pulse edge selection circuit according to the first embodiment can reduce the number of gates passed from clock input to output, resulting in shortened clock delays.

Second Embodiment

<Exemplary Configuration of Pulse Edge Selection Circuit According to the Second Embodiment>

Figure 4:
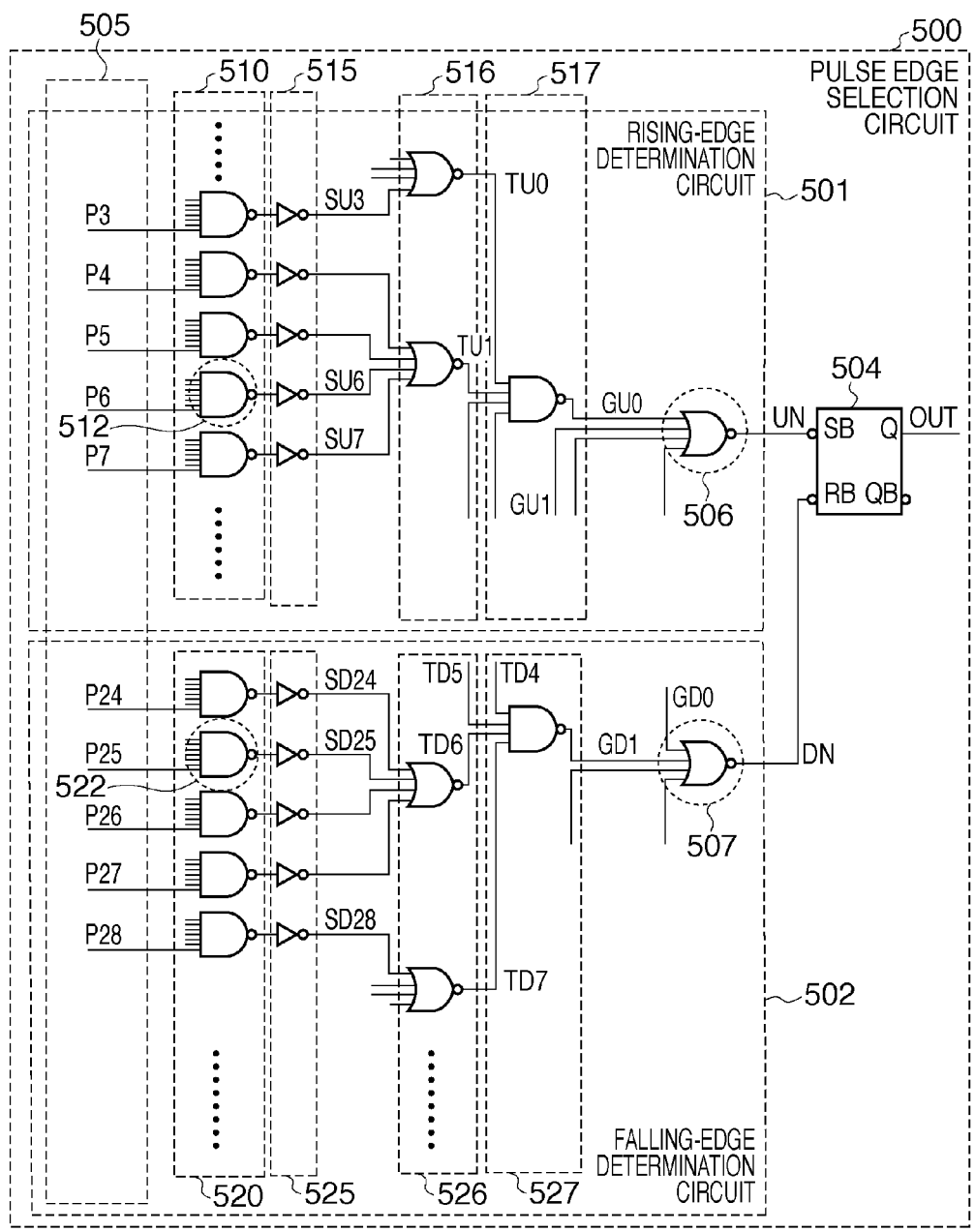
FIG. 4 is a circuit diagram showing an exemplary configuration of a pulse edge selection circuit according to a second embodiment.

FIG. 4 is a circuit diagram showing a pulse edge selection circuit according to a second embodiment. In FIG. 4, reference numeral 500 denotes a pulse edge selection circuit, reference numeral 501 denotes a rising-edge determination circuit, reference numeral 502 denotes a falling-edge determination circuit, reference numeral 504 denotes a falling edge-triggered flip-flop, and reference numeral 505 denotes a multiphase clock line group. Also, reference numerals 510 and 520 denote NAND gate groups in the first stage, reference numerals 515 and 525 denote inverter groups in the second stage, reference numerals 516 and 526 denote NOR gate groups in the third stage, reference numerals 517 and 527 denote NAND gate groups in the fourth stage, and reference numerals 506 and 507 denote NOR gates in the output stage. The falling edge-triggered flip-flop 504 may be the same as the circuit (the flip-flop 104) according to the first embodiment described with reference to FIG. 2B. According to the second embodiment, to generate output OUT pulses of the pulse edge selection circuit 500, a clock P6 is used to determine the time of rise and a clock P25 is used to determine the time of fall, from the multiphase clock line group 505.

In the pulse edge selection circuit 500 according to the second embodiment, the NAND gate groups 510 and 520 in the first stage selects only a single clock each: a clock for a rising edge and a clock for a falling edge, respectively. The selected clocks pass through the inverter groups 515 and 525 in the second stage, the NOR gate groups 516 and 526 in the third stage, the NAND gate groups 517 and 527 in the fourth stage, and the NOR gates 506 and 507 in the output stage, and generate a desired pulse by setting and resetting the falling edge-triggered flip-flop 504. Thus, the activated logic gates are ten logic gates (including inverters) of the edge determination circuits 501 and 502 plus the falling edge-triggered flip-flop 504. In this way, the second embodiment cuts down on power consumption by reducing the number of activated logic gates. Also, the number of logic gates through which clocks pass are five stages (including inverters) each of the edge determination circuits 501 and 502 while the falling edge-triggered flip-flop 504 changes output Q on the falling edge at the input terminal without a disable state. In this way, the second embodiment shortens clock delays by reducing the number of logic gates through which clocks pass.

The DLL 11 is the same as the first embodiment, and thus description thereof will be omitted. The pulse edge selection circuit 500 according to the second embodiment can be used in place of the pulse edge selection circuits 100, 200, 300, and 400 in FIG. 1.

<Operation Timing Chart of Pulse Edge Selection Circuit 500>

Figure 5:
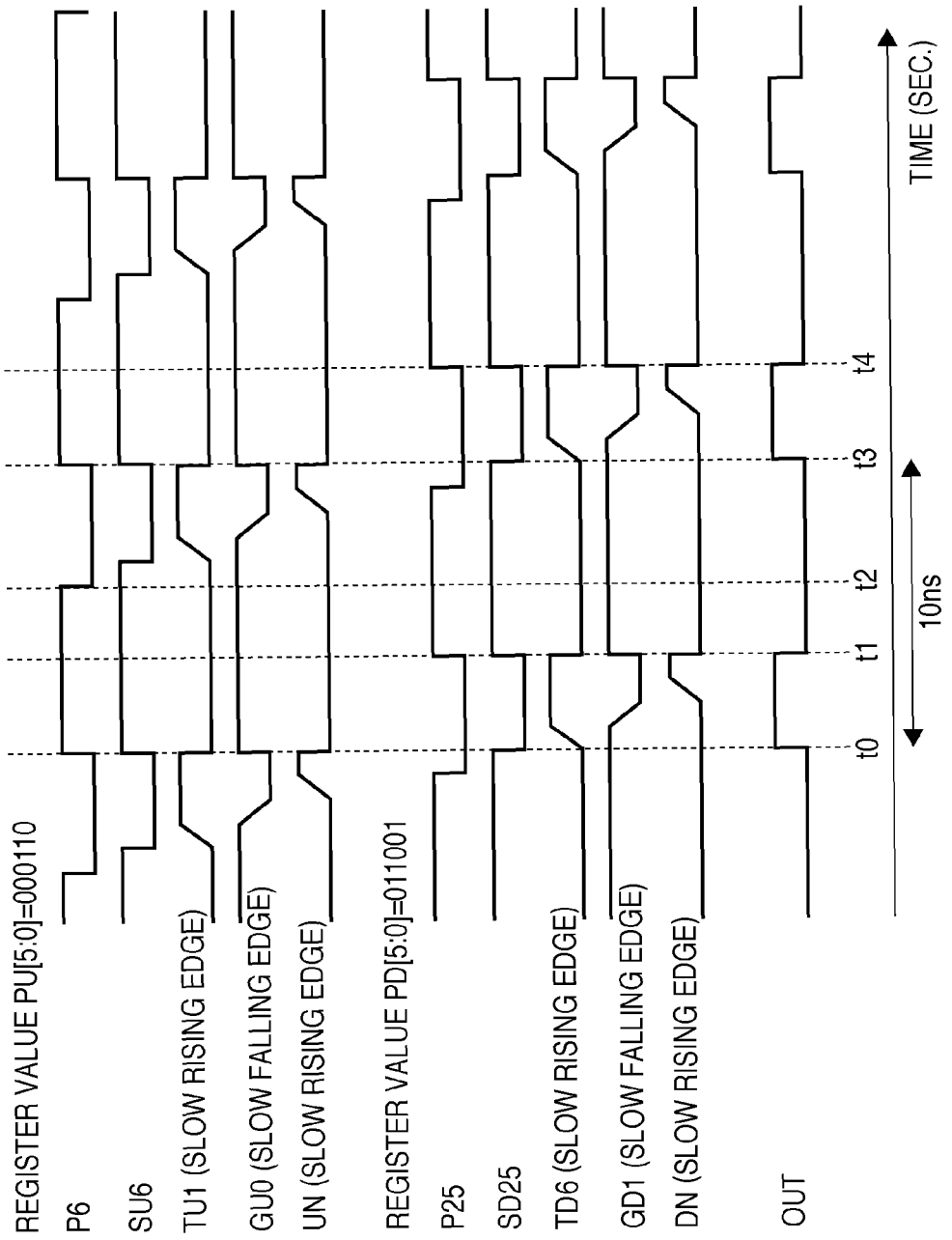
FIG. 5 is a timing chart describing an exemplary operation of the pulse edge selection circuit according to the second embodiment.

FIG. 5 is a timing chart of the pulse edge selection circuit according to the second embodiment. In FIG. 5, the abscissa represents time (seconds) while the ordinate represents voltage values of wires.

(Rising-Edge Determination)

First, the rising-edge determination circuit 501 selects the clock line P6 out of the 64 multiphase clock lines (P0, P1, P2, . . . , P63). Thus, a binary value of "000110" (=6 in decimal) is set on the register PU[5:0] (not shown) in the pulse edge selection circuit 500 based on inputted rising edge data. Consequently, out of the NAND gate group 510 in the first stage, only the selected NAND gate 512 passes the clock (P6). The remaining NAND gates always output High signals. That is, the 64 types of clock inputted via the multiphase clock lines (P0, P1, P2, . . . , P63) are narrowed down to a single type in the first stage of the rising-edge determination circuit 501.

Next, out of the 64 output wires SU1, SU2, ..., SU63 of the inverter group 515 in the second stage, a clock is output only to the wire SU6 and Low signals are always output to the remaining wires. Consequently, out of 16 output wires TU0, TU1, ..., TU15 of the NOR gate group 516 in the third stage, a clock is output only to the wire TU1 and High signals are always output to the remaining wires. Next, out of 4 output wires GU0, GU1, ..., GU3 of the NAND gate group 517 in the fourth stage, a clock is output only to the wire GU0 and Low signals are always output to the remaining 3 wires. The 4 wires GU0, GU1, GU2, and GU3 are connected to input terminals of the NOR gate 506 in the output stage of the rising-edge determination circuit 501. Consequently, as shown in FIG. 5, a signal obtained by inverting the clock on the wire GU0 is output to an output wire UN of the NOR gate 506. That is, a clock which falls simultaneously with the time (time t0 and t3 in FIG. 5) of rise of the clock line P6 is output to the output wire UN of the rising-edge determination circuit 501.

(Falling-Edge Determination)

The falling-edge determination circuit 502 selects the clock line P25 out of the 64 multiphase clock lines (P0, P1, P2, ..., P63). Thus, a binary value of "011001" (=25 in decimal) is set on the register PU[5:0] (not shown) in the pulse edge selection circuit 500 based on inputted falling edge data. Consequently, a NAND gate 522 is selected out of the NAND gate group 520 in the first stage. As a result, with the falling-edge determination circuit 502 operating in a manner similar to the rising-edge determination circuit 501, a clock which falls simultaneously with the time (time t1 or t4 in FIG. 5) of rise of the clock line P25 is output to the output wire DN of the falling-edge determination circuit 502.

As shown in FIG. 4, an input SB of the falling edge-triggered flip-flop 504 is connected with an output wire UN of the rising-edge determination circuit 501 while an input RB is connected with an output wire DN of the falling-edge determination circuit 502. On the other hand, an output Q of the falling edge-triggered flip-flop 504 is connected with an output wire OUT of the pulse edge selection circuit 500. Consequently, as shown in the operation timing chart of FIG. 5, a pulse which rises at the time (t0 or t3) of fall of the wire UN and falls at the time (t1 or t4) of fall of the wire DN is output to the wire OUT. Again, according to the second embodiment, since the falling edge-triggered flip-flop 504 is used, the slow rising edges on the wires UN and DN are not used. Consequently, even if the NOR gates 506 and 507 are used in the clock output stage, slow rising edges do not present a problem. Also, a clock buffer may be connected to the outputs of the NOR gates 506 and 507 in the output stage as required. However, the phase of the clock buffer must not be inverted.

The operation timing chart in FIG. 5 will be described in time sequence. At time t0, the multiphase clock P6 rises from Low to High, output of the selected NAND gate 512 changes from High to Low, and voltage of the wire SU6 is caused to change by an inverter from Low to High. When the wire SU6 changes from Low to High, the voltage of the wire TU1 changes from High to Low, voltage of the wire GU0 changes from Low to High, and voltage of the wire UN falls from High to Low. Consequently, the falling-edge triggered flip-flop 504 operates to change the output OUT (Q) from Low to High. At time t1, the multiphase clock P25 rises from Low to High, voltage of a wire SD25 changes from Low to High, and voltage of a wire TD6 changes from High to Low. As a result, the voltage of a wire GD1 changes from Low to High and voltage of the wire DN falls from High to Low. Consequently, the falling edge-triggered flip-flop 504 operates to change the output OUT (Q) from High to Low. At time t2, the multiphase clock P6 falls from High to Low and the voltage of the wire SU6 changes from High to Low. At this point, although the voltage of wire TU1 changes from Low to High, since the wire TU1 is an output of a 4-input NOR gate, the voltage changes to High at a slow edge rate as illustrated in FIG. 5. Also, although the voltage of wire GU0 changes from High to Low, since the wire GU0 is an output of a 4-input NAND gate, the voltage becomes Low gradually. Also, since the wire UN is an output of the 4-input NOR gate 506, the voltage changes from Low to High at a slow edge rate. There is a time, such as at time t2, when voltage transition is slow, but the slowness does not appear in the output OUT as illustrated in FIG. 5. At time t3, the same operations as at time t0 take place. Also, at time t4, the same operations as at time t1 take place. The pulse edge selection circuit 500 according to the second embodiment can reduce the number of running logic gates, resulting in reduced power consumption as well as reduce the number of gates passed from clock input to output, resulting in shortened clock delays.

Third Embodiment

<Exemplary Configuration of Pulse Edge Selection Circuit According to the Third Embodiment>

Figure 6:
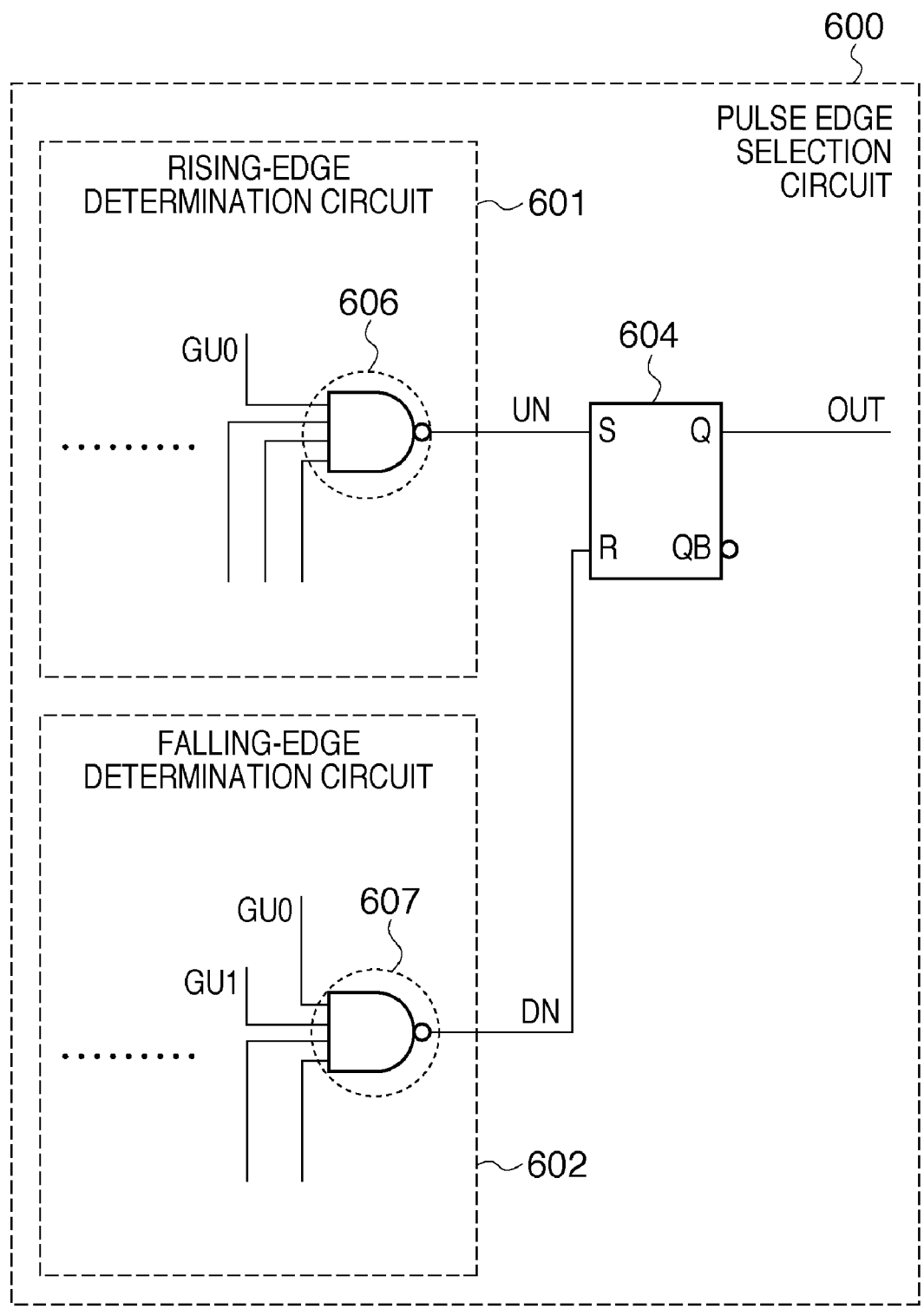
FIG. 6 is a circuit diagram showing an exemplary configuration of a pulse edge selection circuit according to a third embodiment.

FIG. 6 is a circuit diagram showing a pulse edge selection circuit 600 according to a third embodiment. In FIG. 6, reference numeral 601 denotes a rising-edge determination circuit, reference numeral 602 denotes a falling-edge determination circuit, reference numeral 604 denotes a rising edge-triggered flip-flop, and reference numerals 606 and 607 denote NAND gates in the output stage. An S (SET) input terminal of the rising edge-triggered flip-flop 604 is connected with an output wire UN of the NAND gate 606 and an R (RESET) input terminal is connected with an output wire DN of the NAND gate 607. Also, a Q output terminal is connected with an OUT output wire of the pulse edge selection circuit 600. According to the third embodiment, the NAND gates 606 and 607 are used in the output stages of the rising-edge determination circuit 601 and falling-edge determination circuit 602, respectively, to output clocks to the output wires UN and DN. Although not illustrated, the phase of the clocks are determined in the same way as in the first and second embodiments. Since the clocks on the output wires UN and DN are output by the NAND gates 606 and 607, the voltages of the clocks have slow edge rates. However, the use of the rising edge-triggered flip-flop 604 eliminates the need to use the slow falling edges. Configuration of the rising edge-triggered flip-flop 604 will be understood from the falling edge-triggered flip-flop 104 shown in FIG. 2B.

<Example of Sample-Hold Circuit Using Pulse Generation Circuit Resulting from Application of Pulse Edge Selection Circuit According to Present Embodiment>

Figure 7A:
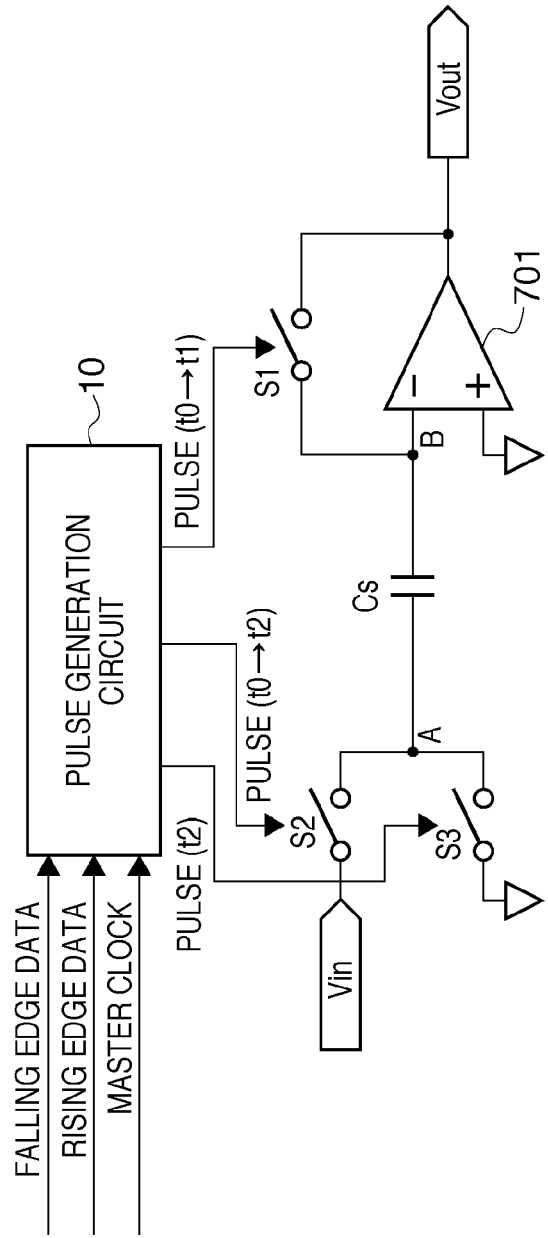
FIG. 7A is a circuit diagram of a sample-hold circuit resulting from application of the pulse generation circuit according to the present embodiment.
Figure 7B:
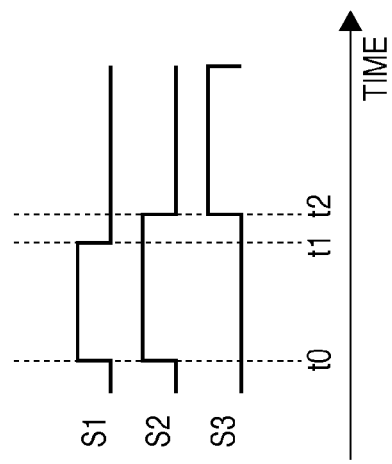
FIG. 7B is a timing chart describing an exemplary operation of the sample-hold circuit.

FIG. 7A shows a sample-hold circuit resulting from application of a pulse generation circuit which in turn results from application of the pulse edge selection circuit according to the present embodiment. FIG. 7A is a circuit diagram of the sample-hold circuit used in an analog-digital conversion circuit and FIG. 7B is an operation timing chart of the sample-hold circuit. In the circuit diagram of FIG. 7A, reference numeral 701 denotes an operation amplifier, reference character Vin denotes an analog input voltage, reference character Vout denotes an output voltage of the operation amplifier 701, reference character Cs denotes sampling capacitance, and reference characters S1, S2, and S3 denote switches. Also, reference character A denotes a wire which connects switches S2 and S3 with the capacitance Cs while B denotes a wire which connects the capacitance Cs with an inverting input terminal (negative terminal) of the operation amplifier 701 and the switch S1. The circuit is an integration of a sample-hold function and a comparator. Activation and deactivation of the switches S1, S2, and S3 are controlled by pulses which are generated by the pulse generation circuit 10 resulting from application of the pulse edge selection circuit according to the present embodiment and have accurate rising and falling edges.

Operation of the circuit in FIG. 7A will be described with reference to the operation timing chart in FIG. 7B. First, at time t0, the switches S1 and S2 are on (closed). Since the switch S1 is on, the operation amplifier 701 is virtually short-circuited, keeping a non-inverting input terminal (positive terminal) of the operation amplifier 701 and the inverting input terminal (negative terminal=wire B) of the operation amplifier 701 at the same potential. On the other hand, since the switch S2 is on, the voltage of the wire A equals the analog input voltage Vin. Next, at time t1, the switch S1 turns off (opened), breaking connection between an output terminal and the inverting input terminal (negative terminal=wire B) of the operation amplifier 701. At time t2, the switch S2 turns off and the switch S3 turns on. Consequently, an input voltage applied to the capacitance Cs is held, generating a potential difference between the negative terminal and positive terminal of the operation amplifier 701. At this point, the operation amplifier 701 acts as a comparator and outputs a logic value of High or Low depending on whether Vin is positive of negative. In the timing chart in FIG. 7B, the interval between time t0 and t2 is referred to as a sampling time and a subsequent interval beginning at t2 is referred to as a holding time. During the sampling time, the switch S1 is turned off slightly earlier than the switch S2. The switch S1 is turned off earlier to increase impedance of the wire B at the time when the switch S2 is turned off. Consequently, charges are held in the capacitance Cs when the switch S2 is on, making it possible to implement a sample-hold circuit with a low offset. The pulse generation circuit 10 provided with the pulse edge selection circuit according to the present embodiment is used for timing generation for the switches S1, S2, and S3. In particular, this is effective in turning off the switch S1 slightly earlier than the switch S2, and the sample-hold circuit does not vary with the temperature, process, or source voltage fluctuations and features reduced power consumption.

<Example of Solid-State Image Sensor Using Pulse Generation Circuit Resulting from Application of Pulse Edge Selection Circuit According to the Above-Mentioned Embodiments>

Figure 8:
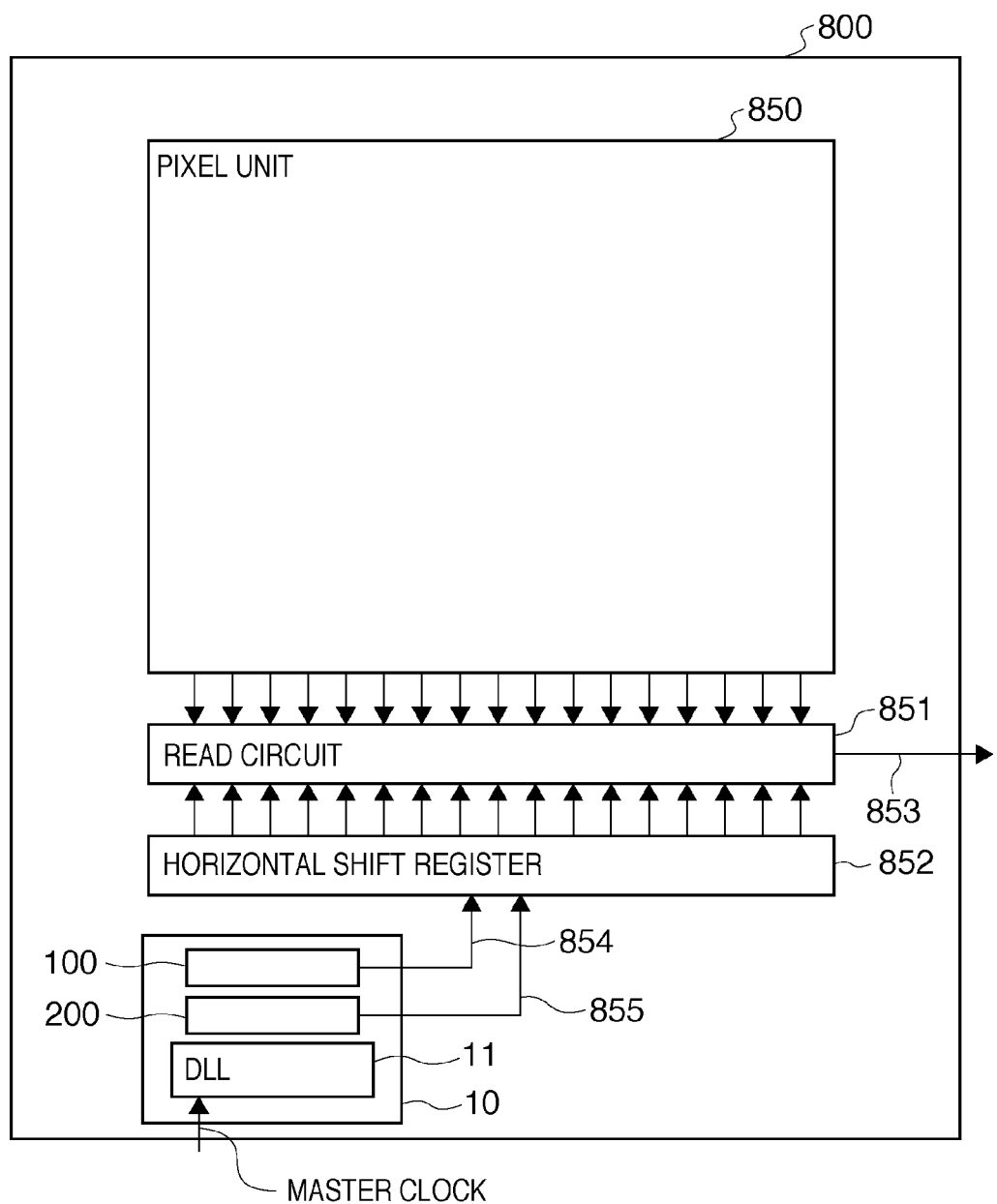
FIG. 8 is a block diagram showing an exemplary configuration of a solid-state image sensor resulting from application of the pulse generation circuit according to the present embodiment.

The pulse edge selection circuit according to the first to third embodiments is also applicable to a solid-state image sensor. FIG. 8 is a block diagram of a solid-state image sensor using the pulse generation circuit resulting from application of the pulse edge selection circuit according to the present embodiment. In FIG. 8, reference numeral 800 denotes a solid-state image sensor which senses an image and generates pixel data. Reference numeral 850 denotes a pixel unit which stores pixel data on a pixel-by-pixel basis. Reference numeral 851 denotes a read circuit which reads the pixel data in parallel out of the pixel unit 850. Reference numeral 852 denotes a horizontal shift register which performs parallel/serial conversion by scanning the parallel pixel data read by the read circuit 851 and thereby outputs serial pixel data. Reference numeral 853 denotes a read signal and reference numerals 854 and 855 denote non-overlapping pulses outputted by the pulse edge selection circuit. The reference numerals used earlier denote the same respective objects as those described earlier. In the solid-state image sensor 800, the pixel unit 850 contains a large number of pixels arranged two-dimensionally. For example, the pixel unit 850 contains 5,000 columns and 3,000 rows of pixels for a total of 15 million pixels. Signals subjected to photoelectric conversion in the pixel unit 850 are read by the read circuit 851. Then, the signals are read out of the solid-state image sensor 800 as the read signal 853 by the horizontal shift register 852 starting from the right. The read signal 853 may be either an analog signal or digital signal. The horizontal shift register 852 is required to be driven at a high frequency due to recent increases in pixel count. To generate shift pulses for 5,000 columns, the horizontal shift register 852 accepts input of two non-overlapping pulses opposite in phase. The pulse generation circuit 10 resulting from application of the pulse edge selection circuit according to the above-mentioned embodiments is used to generate the non-overlapping pulses. The non-overlapping pulses do not vary with the temperature, process, or source voltage fluctuations and reduce power consumption of the solid-state image sensor 800 itself. Furthermore, this improves reliability of the solid-state image sensor.

The pulse edge selection circuits according to the first to third embodiments have gate devices with an 8-input terminal or gate devices with a 4-input terminal in the output stage. However, this is only an example, and rising edges and falling edges can be selected freely as with the present invention regardless of the number of input terminals of individual logic gates using an appropriate combination of NAND gates having multiple input terminals and NOR gates having multiple input terminals. Specifically, pulses with a duty ratio of 20% or the like can be generated freely. Also, such a configuration can reduce the number of logic gates activated by clocks during operation of the circuit, resulting in reduced power consumption.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-298821, filed Dec. 28, 2009, which is hereby incorporated by reference herein in its entirety.

What is claimed is:
1. A pulse edge selection circuit comprising:
  a first clock selection circuit adapted to select and output a first clock used to determine a rising edge of a pulse from among a plurality of clocks shifted in phase;
  a second clock selection circuit adapted to select and output a second clock used to determine a falling edge of the pulse from among the plurality of clocks; and
  an edge detection circuit adapted to generate the pulse using the first clock and the second clock, the edge detection circuit including a first input terminal which accepts input of the first clock from the first clock selection circuit, a second input terminal which accepts input of the second clock from the second clock selection circuit, and an output terminal which outputs the pulse,
  wherein each of the first clock selection circuit and the second clock selection circuit comprises an input stage to accept input of the plurality of clocks and select and pass one clock from among the plurality of clocks, and an output stage to output the selected and passed clock to the edge detection circuit,
  the edge detection circuit detects rising edges of the first clock and the second clock inputted to the first input terminal or the second input terminal from the first clock selection circuit and the second clock selection circuit and generates the pulse which rises on the rising edge of the first clock and falls on the rising edge of the second clock, and the output stage of each of the first clock selection circuit and the second clock selection circuit is a combination of a plurality of NOR gates having a plurality of input terminals and a plurality of NAND gates having a plurality of input terminals, the plurality of NOR gates and the plurality of NAND gates are interconnected such that an input of a NAND gate is connected to an output of a NOR gate and that the input of the NOR gate or an input of another NOR gate is connected to an output of another NAND gate, and a NAND gate is used as an output gate which outputs the first clock and the second clock.

2. A pulse edge selection circuit comprising:

a first clock selection circuit adapted to select and output a first clock used to determine a rising edge of a pulse from among a plurality of clocks shifted in phase;

a second clock selection circuit adapted to select and output a second clock used to determine a falling edge of the pulse from among the plurality of clocks; and an edge detection circuit adapted to generate the pulse using the first clock and the second clock, the edge detection circuit including a first input terminal which accepts input of the first clock from the first clock selection circuit, a second input terminal which accepts input of the second clock from the second clock selection circuit, and an output terminal which outputs the pulse, wherein each of the first clock selection circuit and the second clock selection circuit comprises an input stage to accept input of the plurality of clocks and select and pass one clock from among the plurality of clocks, and an output stage to output the selected and passed clock to the edge detection circuit, the edge detection circuit detects falling edges of the first clock and the second clock inputted to the first input terminal or the second input terminal from the first clock selection circuit and the second clock selection circuit and generates the pulse which rises on the falling edge of the first clock and falls on the falling edge of the second clock, and the output stage of each of the first clock selection circuit and the second clock selection circuit is a combination of a plurality of NOR gates having a plurality of input terminals and a plurality of NAND gates having a plurality of input terminals, the plurality of NOR gates and the plurality of NAND gates are interconnected such that an input of a NOR gate is connected to an output of a NAND gate and that the input of the NAND gate or an input of another NAND gate is connected to an output of another NOR gate, and a NOR gate is used as an output gate which outputs the first clock and the second clock.

3. The pulse edge selection circuit according to claim 2, wherein the output stage of each of the first clock selection circuit and the second clock selection circuit includes a combination of a NOR gate having four or more input terminals and a NAND gate having four or more input terminals.

4. The pulse edge selection circuit according to claim 2, wherein the output stage of each of the first clock selection circuit and the second clock selection circuit includes a combination of a NOR gate having eight or more input terminals and a NAND gate having eight or more input terminals.

5. A pulse generation circuit comprising:

the pulse edge selection circuit according to claim 2; and a clock generation circuit adapted to generate a plurality of clocks shifted in the phase, based on a master clock, and supply the plurality of clocks to the pulse edge selection circuit.

6. A sample-hold circuit comprising:

a capacitor;

an operation amplifier circuit connected to the capacitor and adapted to output a voltage held in the capacitor;

a first switch adapted to supply an input voltage to the capacitor and thereby charge the capacitor;

a second switch installed in a feedback circuit of the operation amplifier circuit;

a third switch adapted to ground an input side of the capacitor; and the pulse generation circuit according to claim 5 adapted to generate a plurality of pulses used to switch the first to third switches.

7. A solid-state image sensor comprising:

a pixel unit adapted to store pixel data of a sensed image;

a read circuit adapted to read the pixel data in parallel out of the pixel unit; and a shift register adapted to perform parallel/serial conversion of the pixel data read out in parallel by the read circuit and thereby output the pixel data serially, wherein a pulse used to drive the shift register is supplied by the pulse generation circuit according to claim 5.

* * * * *